US009625879B2

(12) United States Patent
Wang et al.

(10) Patent No.: US 9,625,879 B2
(45) Date of Patent: Apr. 18, 2017

(54) METHOD FOR FABRICATING A COLORED COMPONENT FOR A WATCH

(71) Applicant: Master Dynamic Limited, Shatin, New Territories (HK)

(72) Inventors: Ying Nan Wang, Shatin (HK); Ching Tom Kong, New Territories (HK)

(73) Assignee: Master Dynamic Limited, Hong Kong (HK)

( * ) Notice: Subject to any disclaimer, the term of this patent is extended or adjusted under 35 U.S.C. 154(b) by 104 days.

(21) Appl. No.: 14/283,928

(22) Filed: May 21, 2014

(65) Prior Publication Data

US 2014/0356638 A1    Dec. 4, 2014

(30) Foreign Application Priority Data

May 21, 2013  (HK) .................................. 13105967

(51) Int. Cl.
*B05D 5/06* (2006.01)
*G04B 19/26* (2006.01)
(Continued)

(52) U.S. Cl.
CPC ............ *G04B 19/268* (2013.01); *C23C 14/35* (2013.01); *G03F 7/20* (2013.01); *G03F 7/26* (2013.01); *G04B 19/12* (2013.01); *G04D 3/0092* (2013.01)

(58) Field of Classification Search
CPC ....... C23C 16/345; C23C 14/30; C23C 14/35; B05D 5/06; H05H 1/24
See application file for complete search history.

(56) References Cited

U.S. PATENT DOCUMENTS 4,599,251 A    7/1986  Feller
5,639,671 A *  6/1997  Bogart ................... B82Y 15/00
                                                          359/581
(Continued)

FOREIGN PATENT DOCUMENTS

DE    3635567 A1    5/1987
EP    0399072 A1    11/1990
(Continued)

OTHER PUBLICATIONS

Hoffman, David M., et al., "Plasma-enhanced chemical vapor deposition of silicon, germanium, and tin nitride thin films from metalorganic precursors." J. Vac. Sci. Technol. A 13(3), May/Jun. 1995, pp. 820-825.*

(Continued)

*Primary Examiner* — Bret Chen
(74) *Attorney, Agent, or Firm* — Kolisch Hartwell, P.C.

(57) ABSTRACT

A method of fabricating a component for use in a watch includes a step of depositing a first thin film on a wafer wherein the first thin film is adapted to allow light reflected away from the wafer to be indicative of a first color characteristic. The step of depositing the first thin film is performed by using a plasma-enhanced chemical vapor deposition process or a low pressure chemical vapor deposition process. The method may further include a step of fabricating a second color characteristic, including defining a pattern on the first thin film using photolithography, and, processing a region within a boundary of the pattern so that the region is adapted to allow light reflected away from the wafer to be indicative of the second color characteristic. The step of processing the region within the boundary of the pattern includes depositing a metal or a ceramic material within the boundary of the pattern which is indicative of the second color characteristic. The step of processing the region within the boundary of the pattern may also include (Continued)

depositing a second thin film within the region within the boundary of the pattern.

14 Claims, 4 Drawing Sheets

(51) Int. Cl.
*G04D 3/00* (2006.01)
*G04B 19/12* (2006.01)
*C23C 14/35* (2006.01)
*G03F 7/20* (2006.01)
*G03F 7/26* (2006.01)

(56) References Cited

U.S. PATENT DOCUMENTS

| | | | |
|---|---|---|---|
| 5,888,593 A | | 3/1999 | Petrmichl et al. |
| 6,103,572 A | * | 8/2000 | Kirihara ............ H01L 29/66833 257/E21.423 |
| 2007/0170540 A1 | * | 7/2007 | Chung ................ B81C 1/00801 257/499 |
| 2008/0245765 A1 | * | 10/2008 | Khaselev ........ H01L 31/022425 216/13 |
| 2009/0140437 A1 | * | 6/2009 | Saeki ................ H01L 21/28273 257/776 |
| 2010/0252099 A1 | * | 10/2010 | Lin ................... H01L 31/02167 136/256 |

FOREIGN PATENT DOCUMENTS

| EP | 2149540 A1 | 2/2010 |
|---|---|---|
| JP | 2006029866 A | 2/2006 |
| JP | 2010216898 A | 9/2010 |

OTHER PUBLICATIONS

Kubacki, Ronald M., "Low Temperature Plasma Deposition of Silicon Nitride to Produce Ultra-Reliable, High Performance, Low Cost Sealed Chip-on-Board (SCOB) Assemblies". 1994 IEEE/CPMT Int'l Electronics Manufacturing Technology Symposium, pp. 273-280.*

WatchQuote brochure: Richard Mille RM 011 Brown Silicon Nitride, Feb. 2013, pp. 1-4.*

UK Intellectual Property Office, "Search Report" in connection with related Hong Kong Short Term Patent App. No. 13105967.3, dated Feb. 17, 2014, 2 pages.

European Patent Office. "Extended European Search Report" in connection with related European Patent Application No. 14169164.2, dated Mar. 14, 2016, 6 pages.

* cited by examiner

METHOD FOR FABRICATING A COLORED COMPONENT FOR A WATCH

TECHNICAL FIELD

The present invention related to a watch component, method, and apparatus for fabricating same, and in particular, colored watch components such as those used in a moon-phase display of the watch.

BACKGROUND OF THE INVENTION

Certain watches contain colored components in the dial section of the watch, for instance, to form part of a moon-phase display for indicating the phase of the moon at any given time.

It is desirable for the color characteristic of such watch components to be high quality and precision so as to improve the visual contrast and hence readability of the indicator, as well as enhancing the ornamental and aesthetic qualities of the indicator.

The color characteristics of the watch components may be provided by virtue of the natural colors of the materials forming the components. For example, materials with natural color characteristics typically include metals, metal alloys and metal oxides which tend to have good mechanical properties and are suitably durable for use as watch components. Normally, a gold color may be provided by electroplated gold, and, a blue color on the hour and minute hands may be provided by an oxidized steel material at a well controlled temperature. The disadvantage with utilizing the natural colors of these types of materials suitable for forming the watch display components is that the range of suitable materials, and colors available, is limited.

Alternatively, a broader range of color characteristics of the watch display components may be provided by painting the components a desired range of colors. However, the quality and sharpness of the contours of colored patterns painted on the watch display materials are unsuitable for use in high-end watches. In order to achieve higher quality of color components in high end watches, gold may be used as a wafer for a moon-phase indicator of a watch with a diamond-like carbon film coating whereby a laser beam is used to remove the diamond like carbon in the desired areas of the watch display to expose the gold wafer. Whilst this method tends to produce a high quality moon-phase display, the processing costs are relatively high and the process efficiency is relatively low.

SUMMARY OF THE INVENTION

The present invention seeks to alleviate at least one of the problems discussed above in relation to the prior art.

The present invention may involve several broad forms. Embodiments of the present invention may include one or any combination of the different broad forms herein described.

In a first broad form the present invention provides a method of fabricating a component for use in a watch, the component including a wafer, and the method including a step of depositing a first thin film on the wafer wherein the first thin film is adapted to allow light reflected away from the wafer to be indicative of a first color characteristic.

Preferably, the wafer may include an opaque material. More preferably, the wafer may include a silicon wafer.

Preferably, the step of depositing the first thin film on the wafer may include use of at least one of a plasma-enhanced chemical vapor deposition (PECVD) process and a low pressure chemical vapor deposition (LPCVD) process Preferably, the first thin film may include a silicon nitride material. Also preferably, the first thin film may include a refractive index greater than 2.

Preferably, the present invention may include a further step of fabricating a second color characteristic on the wafer. The further step may include defining a pattern on the first thin film using photolithography, and, processing a region within a boundary of the pattern so that the region may be adapted to allow light reflected away from the wafer to be indicative of the second color characteristic. Typically, the pattern may be indicative of a moon or a star shape.

Typically, the step of processing the region within the boundary of the pattern may include depositing a metal or a ceramic material within the boundary of the pattern which is indicative of the second color characteristic. Preferably, this may involve the use of a magnetron sputtering deposition or an electron-beam evaporation deposition process. Typically, the first thin film within the boundary of the pattern may be removed, for instance by HF solution or dry etching, before the metal or ceramic material is deposited.

Also typically, the step of processing the region within the boundary of the pattern may include removing at least some of the first thin film within the boundary of the pattern, for instance by HF solution or dry etching, and then depositing a second thin film therein which is suitably adapted to produce the second color characteristic. Preferably, the second thin film may be deposited using a plasma-enhanced chemical vapor deposition (PECVD) process. Preferably, the second thin film may also include a silicon nitride material.

Also typically, the step of processing the region within the boundary of the pattern may include depositing a second thin film within the region within the boundary of the pattern without removing any of the first thin film within the boundary of the pattern such that the second thin film either alone or in combination with the first thin film may be adapted to produce the second color characteristic. Preferably, the second thin film may be deposited using a plasma-enhanced chemical vapor deposition (PECVD) process. Preferably, the second thin film may also include a silicon nitride material.

Also typically, the step of processing the region within the boundary of the pattern may include thinning the first thin film within the boundary of the pattern to a desired thickness suitable for producing the second color characteristic. The thinning may be performed for instance using HF solution or dry etching.

Advantageously, the use of photolithography may assist in defining the boundary of the pattern with relatively high precision and definition—i.e. typically in the order of a few hundred nanometers—such that deposition of materials such as metals, ceramics, thin films and the like on to the wafer within the boundaries of a pattern may be of suitably high quality and accuracy for application in ornamentation of luxury watches and the like. Also advantageously, components with durability and optical precision may be mass produced using photolithographic MEMS technologies.

In a second broad form the present invention provides an apparatus for fabricating a component for use in a watch, the apparatus being configured for depositing a first thin film on a wafer of the component wherein the first thin film is adapted to allow light reflected away from the wafer to be indicative of a first color characteristic.

Preferably, the wafer may include an opaque material. More preferably, the wafer may include a silicon wafer.

Preferably, the present invention may be configured to deposit the first thin film on the wafer in accordance with a plasma-enhanced chemical vapor deposition (PECVD) process or a low pressure chemical vapor deposition (LPCVD) process.

Preferably, the first thin film may include a silicon nitride material. Also preferably, the first thin film may include a refractive index greater than 2.

Preferably, the present invention may be configured to fabricate a second color characteristic on the wafer. More preferably, the present invention may include a photolithography apparatus configured to define a pattern on the first thin film, and, an apparatus for processing a region within a boundary of the pattern so that the region within the boundary of the pattern may be adapted to allow light reflected away from the wafer to be indicative of the second color characteristic. Typically, the pattern may be indicative of a moon or a star shape.

Typically, the apparatus for processing the region within the boundary of the pattern may be configured to deposit a metal or a ceramic material within the boundary of the pattern which is indicative of the second color characteristic. Preferably, this may include a magnetron sputtering deposition apparatus or an electron-beam evaporation deposition apparatus. The first thin film within the boundary of the pattern may be removed, for instance by HF solution or dry etching, before the metal or ceramic material is deposited.

Also typically, the apparatus for processing the region within the boundary of the pattern may be configured to remove at least some of the first thin film within the boundary of the pattern, for instance by HF solution or dry etching, and then deposit a second thin film therein which is suitably adapted to produce the second color characteristic. Preferably, the second thin film may be deposited using a plasma-enhanced chemical vapor deposition (PECVD) process. Preferably, the second thin film may also include a silicon nitride material.

Also typically, the apparatus for processing the region within the boundary of the pattern may be configured to deposit a second thin film on to the region within the boundary of the pattern without removing any of the first thin film within the boundary of the pattern such that the second thin film either alone or in combination with the first thin film may be adapted to produce the second color characteristic. Preferably, the second thin film may be deposited using a plasma-enhanced chemical vapor deposition (PECVD) process. Preferably, the second thin film may also include a silicon nitride material.

Also typically, the apparatus for processing the region within the boundary of the pattern may be configured for thinning the first thin film within the boundary of the pattern to a desired thickness suitable for producing the second color characteristic. The thinning may be performed for instance using HF solution or dry etching.

In a third broad form, the present invention provides a component for use in a watch, the component including a wafer having a first thin film disposed thereon wherein the first thin film is adapted to allow light reflected away from the wafer to be indicative of a first color characteristic.

Preferably, the wafer includes an opaque material. More preferably, the wafer includes a silicon wafer.

Preferably the first thin film disposed on the silicon wafer may be fabricated according to a plasma-enhanced chemical vapor deposition (PECVD) process or a low pressure chemical vapor deposition (LPCVD) process.

Preferably, the first thin film may include a silicon nitride material. Also preferably, the first thin film may include a refractive index greater than 2.

Preferably, a first region of the first thin film may include a pattern having a boundary defined by a photolithography process, and, a region within the boundary of the pattern includes a material adapted to allow light reflected away from the wafer to be indicative of a second color characteristic.

Typically, the material disposed within the boundary of the pattern may include a metal or a ceramic material. Preferably, the metal or ceramic material may be deposited within the boundary of the pattern by use of a magnetron sputtering deposition process or an electron-beam evaporation deposition process. Alternatively and/or additionally, the region within the boundary of the pattern may include a second thin film disposed therein, the second thin film being adapted to allow light reflected away from the wafer which is indicative of a second color characteristic. Typically the second thin film may include a silicon nitride material. Alternatively, a region within a boundary of the pattern may include a thinned portion of the first thin film adapted to be indicative of a second color characteristic different too that of the first color characteristic.

Preferably the component includes a moon-phase display suitable for use in a watch. Also preferably, the pattern disposed on the first thin film may include a moon or a star shape.

In a fourth broad form the present invention provides a method of fabricating a component for use in a watch, the component including a wafer, and the method including steps of:

(i) defining a pattern on the wafer using photolithography; and (ii) processing a region within a boundary of the pattern so that it may be adapted to allow light reflected away from the wafer to be indicative of a color characteristic.

Typically, the step of processing the region within the boundary of the pattern may include depositing a metal or a ceramic material within the boundary of the pattern which is indicative of the color characteristic. Preferably, this may involve the use of a magnetron sputtering deposition or an electron-beam evaporation deposition process.

Also typically, the step of processing the region within the boundary of the pattern may include depositing a thin film therein which is suitably adapted to produce the color characteristic. Preferably, the thin film may be deposited using a plasma-enhanced chemical vapor deposition (PECVD) process. Preferably, the thin film may also include a silicon nitride material.

Preferably, the component may include a moon-phase display of a watch. Also preferably, the pattern may include a moon or a star shape.

In a fifth broad form the present invention provides an apparatus for fabricating a component for use in a watch, including:

(i) a photolithography apparatus configured for defining a pattern on a wafer of the component; and (ii) a processing apparatus for processing a region within a boundary of the pattern wherein it may be adapted to allow light reflected away from the wafer to be indicative of a color characteristic.

Typically, the processing apparatus for processing the region within the boundary of the pattern may be configured to deposit a metal or a ceramic material within the boundary of the pattern which is indicative of the color characteristic. More preferably, the processing apparatus may include a magnetron sputtering deposition apparatus or an electron-beam evaporation deposition apparatus.

Also typically, the processing apparatus for processing the region within the boundary of the pattern may be configured to deposit a thin film therein which is suitably adapted to produce the color characteristic. Preferably, the thin film may be deposited using a plasma-enhanced chemical vapor deposition (PECVD) process. Preferably, the thin film may also include a silicon nitride material.

Preferably, the component may include a moon-phase display of a watch. Also preferably, the pattern may include a moon or a star shape.

BRIEF DESCRIPTION OF THE DRAWINGS

The present invention will become more fully understood from the following detailed description of a preferred but non-limiting embodiment thereof, described in connection with the accompanying drawings, wherein.

DETAILED DESCRIPTION OF THE PREFERRED EMBODIMENTS

Embodiments of the present invention will now be described with reference to FIGS. 1 to 4.

Figure 1:
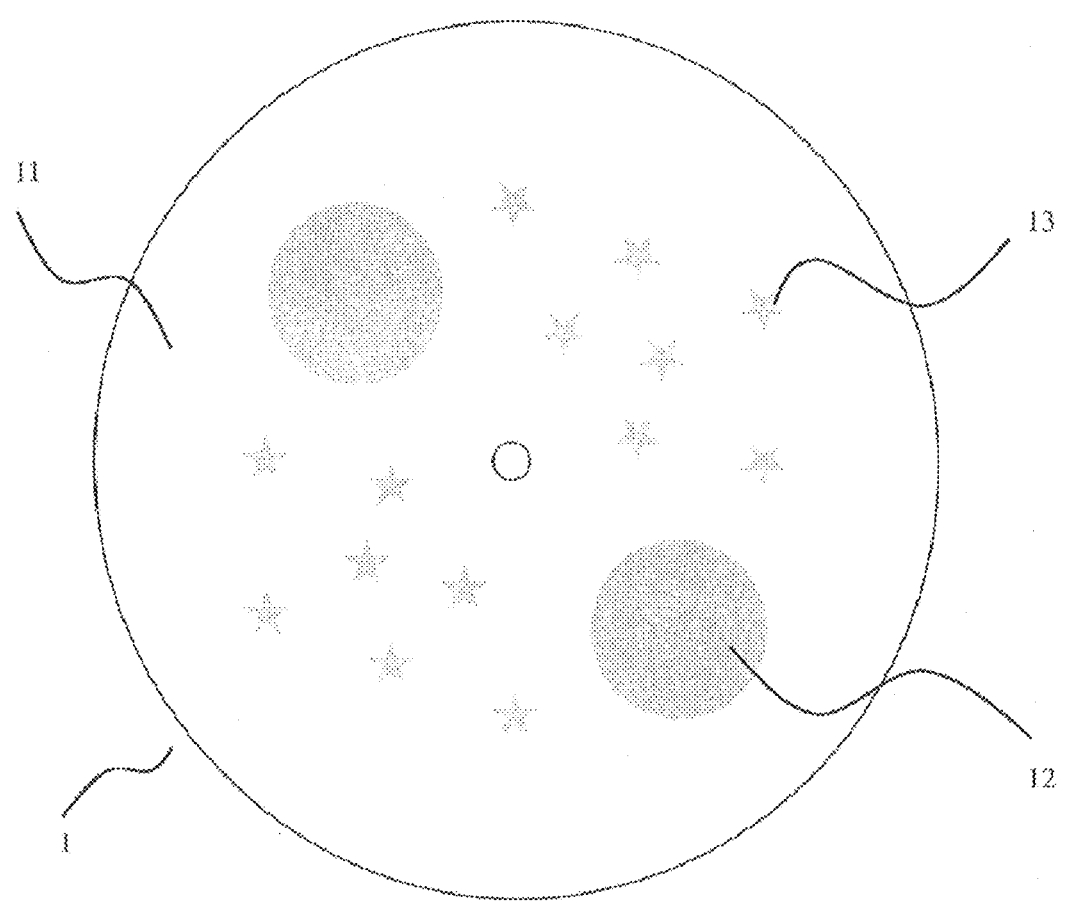
FIG. 1 depicts a moon-phase display component for a watch having multiple colors in accordance with an embodiment of the present invention.
Figure 2:
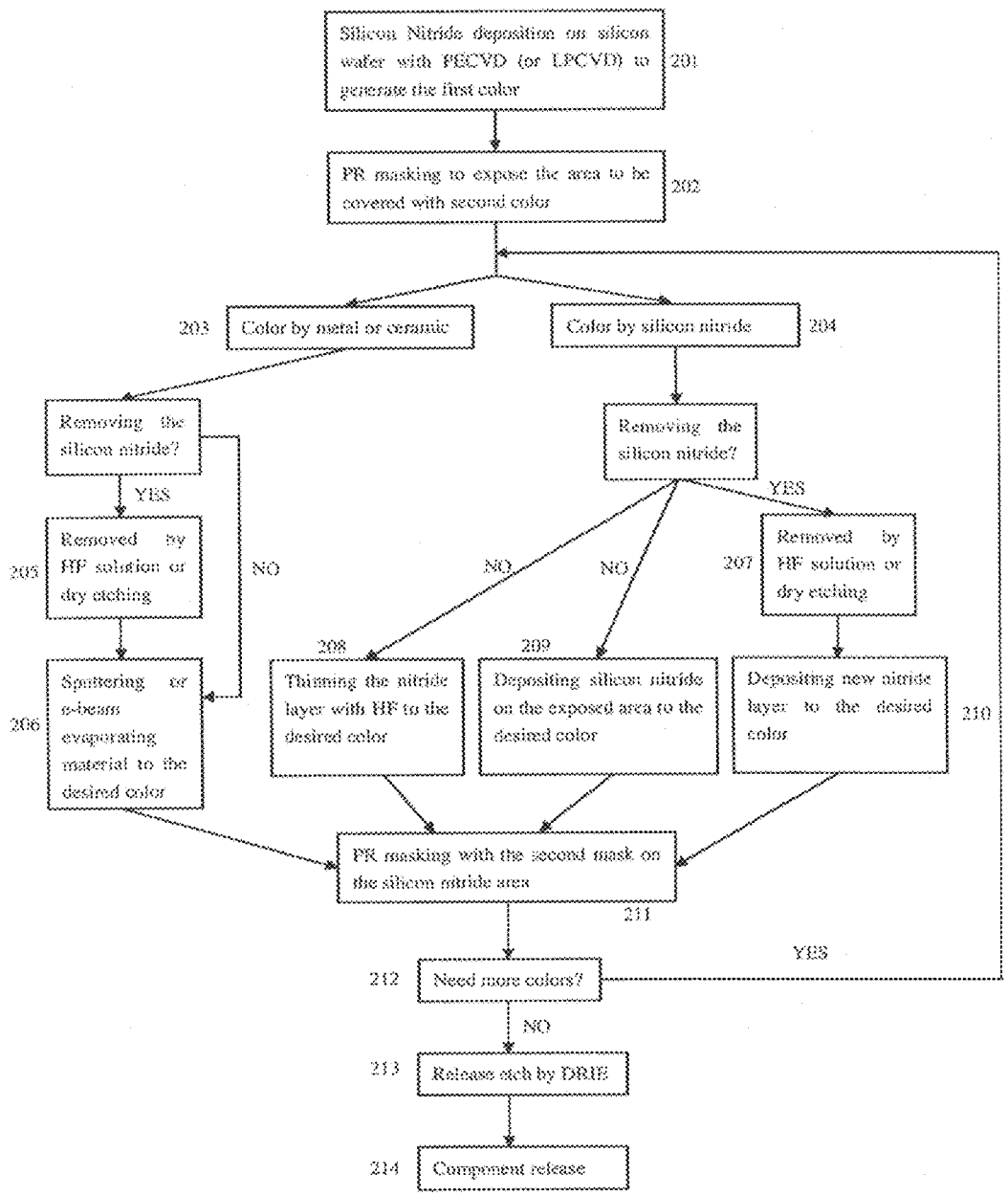
FIG. 2 depicts a flow chart of method steps which may be performed to fabricate the moon-phase display component for a watch having multiple colors in accordance with a further embodiment of the present invention.
Figure 3:
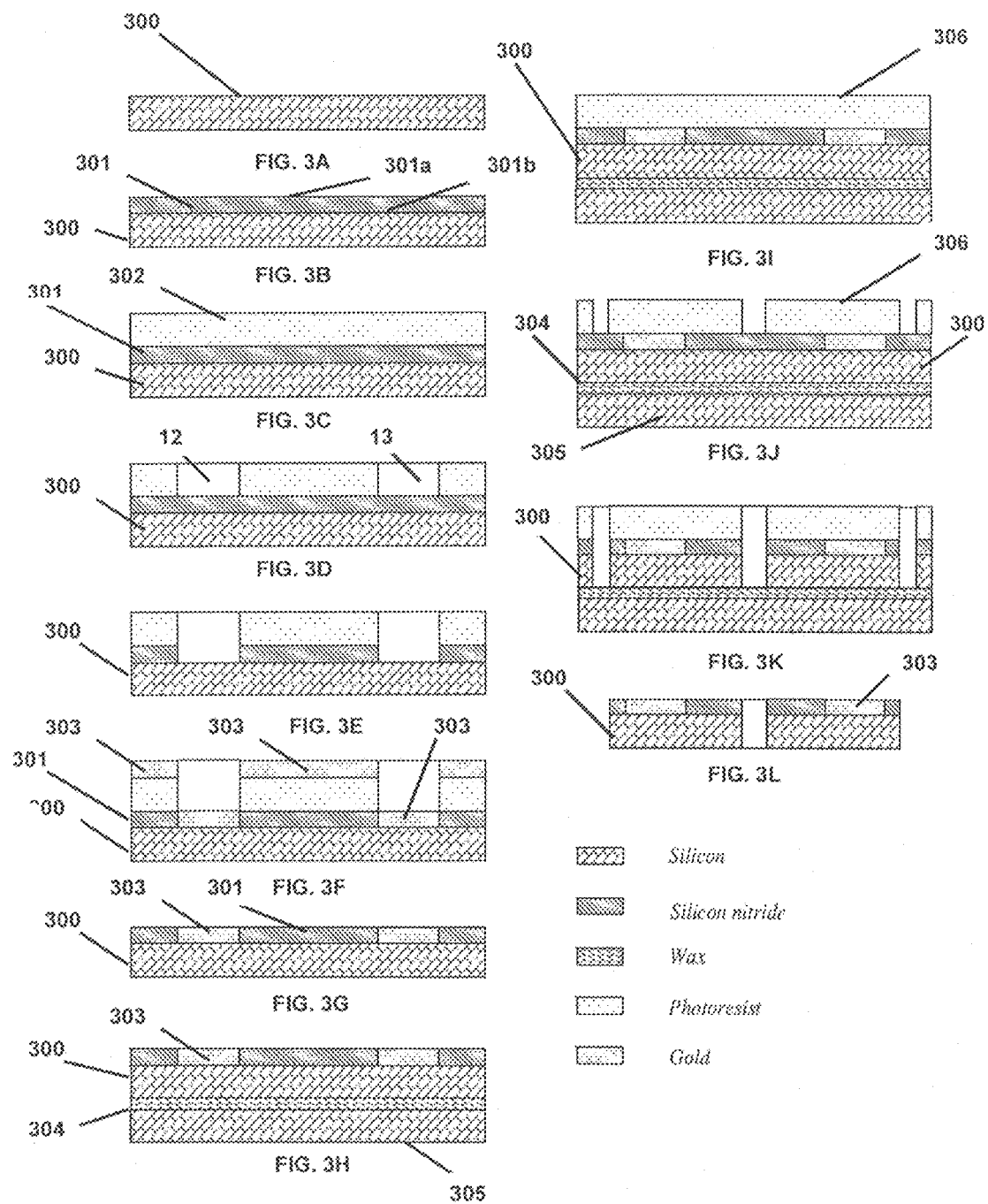
FIG. 3A depicts a cross sectional view of a moon-phase display component for a watch where the base of the moon-phase display is formed by using opaque silicon wafer in accordance with embodiment of the present invention.
FIG. 3B depicts a cross sectional view of a moon-phase display component having a first thin film of silicon nitride deposited on to the silicon wafer in accordance with an embodiment of the present invention.
FIG. 3C depicts a cross sectional view of a moon-phase display component having the photoresist mask coated on to the first thin film of the silicon wafer in accordance with an embodiment of the present invention.
FIG. 3D depicts a cross sectional view of a moon-phase display component having the photoresist coated silicon wafer exposed under UV light causing a chemical change in specific regions of the photoresist mask corresponding to the moon and stars patterns on the moon-phase display in accordance with an embodiment of the present invention.
FIG. 3E depicts a cross sectional view of a moon-phase display component when the silicon nitride within boundaries of the patterns not covered by the photoresist are etched away by HF in accordance with embodiment of the present invention.
FIG. 3F depicts a cross sectional view of a moon-phase display component having a thin layer of chromium or titanium deposited on to the exposed silicon before sputtering gold in accordance with an embodiment of the present invention.
FIG. 3G depicts a cross sectional view of a moon-phase display component where the silicon wafer is covered with gold only in the area of the moon and stars patterns in accordance with an embodiment of the present invention.
FIG. 3H depicts a cross sectional view of a moon-phase display component where the silicon wafer is bonded to a handle wafer with wax in accordance with an embodiment of the present invention.
FIG. 3I depicts a cross sectional view of a moon-phase display component having another layer of photoresist coated on the silicon wafer for performing a secondary lithography process in accordance with an embodiment of the present invention.
FIG. 3J depicts a cross sectional view of a moon-phase display component having the photoresist aligned with marks on the wafer generated by the first mask in accordance with an embodiment of the present invention.
FIG. 3K depicts a cross sectional view of a moon-phase display component where the silicon wafer is ready for etching with the exposed area covered with silicon nitride in accordance with an embodiment of the present invention.
FIG. 3L depicts a cross sectional view of a moon-phase display component where the silicon wafer is fully etched in accordance with an embodiment of the present invention.
Figure 4:
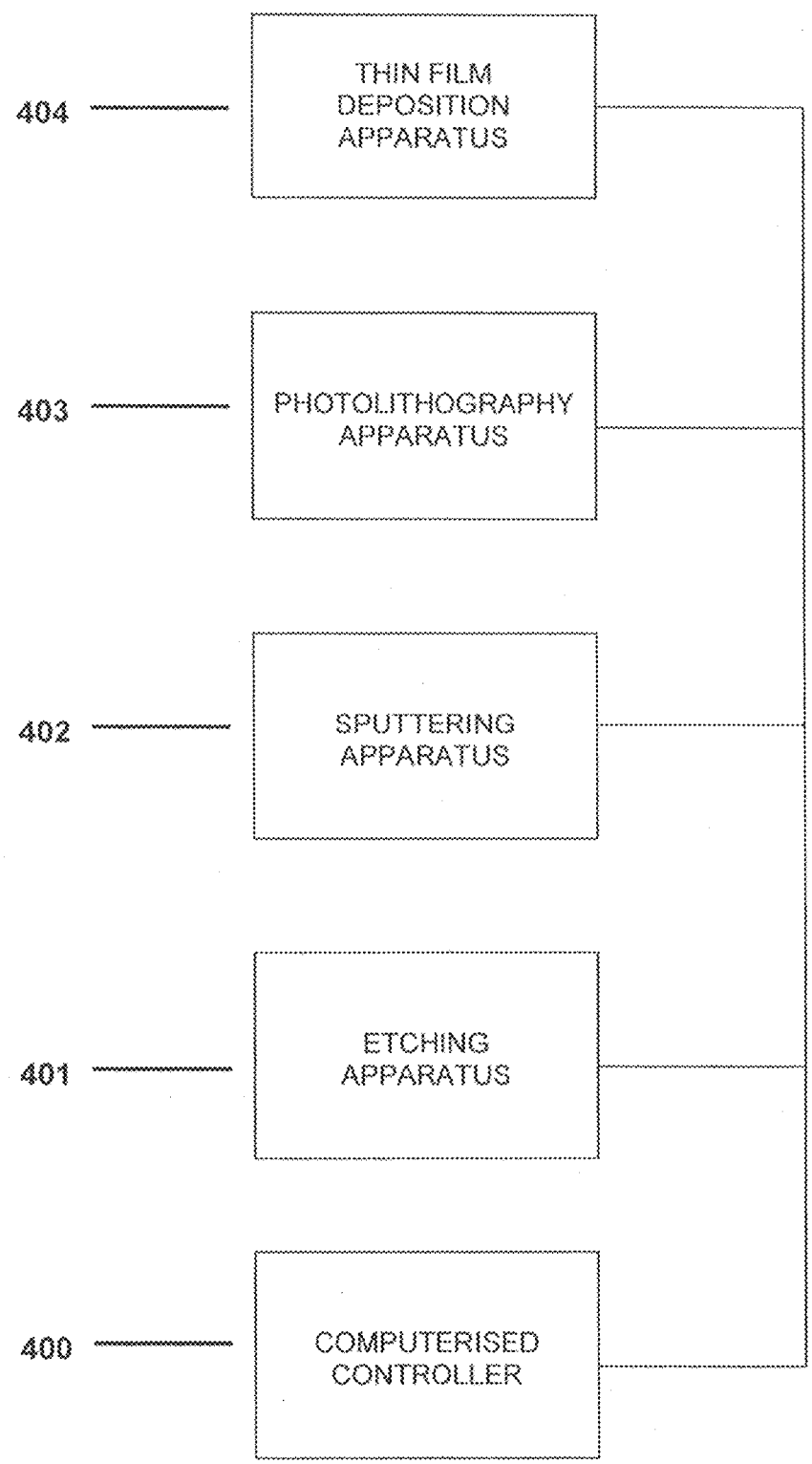
FIG. 4 depicts a functional block diagram of an apparatus for fabricating the moon-phase display component for a watch in accordance with an embodiment of the present invention, the moon-phase display including multiple color characteristics.

Referring firstly to FIGS. 2 and 4, an apparatus and method of using same is provided in accordance with embodiments of the present invention for use in fabricating a watch component (1) as shown in FIG. 1 having multiple color characteristics. By way of example, the watch component (1) fabricated in accordance with these embodiments includes a moon-phase display having a blue colored background (11), and gold colored moon (12) and stars (13) pattern. It should be understood that other types of watch components with other types of color characteristics may of course also be fabricated using this apparatus.

As shown in FIG. 4, the apparatus includes a computerized controller (400) having an input and output user interface which is configured for controlling a thin film deposition apparatus (404), a photolithography apparatus (403), a sputtering apparatus (402) and an etching apparatus (401).

An opaque silicon wafer (300) is used to form the base of the moon-phase display (1) as shown in FIG. 3A. A first thin film of silicon nitride (301) is deposited on to the silicon wafer (300) as shown in FIG. 3B with the first thin film (301) having a thickness in the sub-nanometer to micron range so as to reflect certain wavelengths of light. This step is represented by block (201) in FIG. 2. Before the first thin film (301) is deposited on the silicon wafer (300) by the thin film deposition apparatus (404), the silicon wafer (300) is thoroughly cleaned (e.g. in accordance with "RCA" standardized procedure) to remove small particles on the silicon surface which may give rise to defects in the first thin film (301).

In the preferred embodiments, the apparatus is configured to deposit the first thin film (301) of silicon nitride on to the silicon wafer (300) using a plasma-enhanced chemical vapor deposition (PECVD) process or a low pressure chemical vapor deposition (LPCVD) process. PECVD and LPCVD processes are suitable for use in producing ultra thin film with high refractive index whereby the reflected light exhibits good monochromatic properties.

As light strikes the first thin film (301), it is both transmitted and reflected at the upper surface of (301a) the first thin film (301). The light transmitted through the upper surface (301a) reaches the lower surface (301b) interfaced with the silicon wafer (300) and is reflected away from the silicon wafer (300) with the light reflected away from the upper (301a) and lower surfaces (301b) undergoing interference. For a given first thin film (301) with a reflective index of n, a film thickness of d, the reflected wavelength is governed by the equation of $m\lambda = 2nd \cos\theta$ where m is the order of the interfered light, $\lambda$ is the wavelength of the reflected light, and $\theta$ is the incident angle inside the first thin film (301). The blue background of the moon-phase display (1) can thus be fabricated by depositing the first thin film (301) to a thickness (typically around about 937.5 Å) in accordance with the above equation and parameters which reflects light indicative of blue as perceived by the human eye.

The gases used in the preferred embodiments for growing of silicon nitride (301) by PECVD include silane, ammonia, and nitrogen. The deposition rate of the silicon nitride first thin film (301) can be controlled by the flow rate of these gases, the RF power, the deposition pressure and other parameters. In order to have good control of the thin film thickness, a relatively low growth rate is preferable. The PECVD machine used in embodiments of the present invention includes an Oxford Plasma 80 machine providing a controlled growth rate of approximately 23 nm/min. By changing the deposition time, the thin film thickness can by tightly controlled, and in turn, the wavelength of the reflected light and perceived color of the thin film may similarly be tightly controlled. LPCVD has an even slower growth rate, which results in a relatively dense film.

The apparatus is also configured to fabricate a second color characteristic in the form of a gold color patterned moon (12) and stars (13) on the moon phase display.

During the fabrication, two masks are needed. The first mask is for patterning the silicon wafer with the moon (12) and stars (13); the second one is for etching through the wafer and releasing the moon phase displays from the wafer.

The photoresist mask (302) is coated on to the first thin film (301) of the silicon wafer (300) by the photolithography apparatus (403) and baked as shown in FIG. 3C. This step is represented by block (202) in FIG. 2. For high resolution photolithography a positive photoresist mask (302) such as AZ 5214E is normally used. The photoresist (302) is spin-coated on to the first thin film (301) of the silicon wafer (300) at a speed of 4000 RPM which results in a thickness of about 1.4 µm.

After baking, the photoresist (302) coated silicon wafer (300) is then exposed under UV light by the photolithography apparatus (403) which causes a chemical change in specific regions of the photoresist mask (302) corresponding to the moon (12) and stars (13) patterns (shown in FIG. 3D) that can thereafter be removed from the photoresist (302) by developer such as AZ 300 MIF before being baked again. The baking assists in enhancing the adhesion between the photoresist (302) and the silicon wafer (300) so as to avoid defects arising in the following steps. The thin positive photoresist mask (302) assists in defining a relatively sharper and more precise boundary of the moon (12) and stars (13) patterns which subsequently results in sharper transfer of the moon (12) and stars (13) patterns on to the silicon wafer (300).

The silicon wafer (300) is next ready for etching in HF solution whereby the silicon under the moon (12) and stars (13) patterns is exposed when the silicon nitride (301) within boundaries of the patterns not covered by the photoresist (302) are etched away by HF as shown in FIG. 3E. The etching time of this step is of importance because over-etching of silicon nitride (301) will adversely affect the quality of the resulting moons (12) and stars (13) patterns. After cleaning in deionized water, the silicon wafer (300) is blown dry with nitrogen.

Thereafter, gold particles are sputtered on to the exposed silicon within the boundaries of the moon (12) and stars (13) patterns using the sputtering apparatus (402) which could for instance be either a magnetron sputtering deposition apparatus or electron-beam evaporation deposition apparatus. In seeking to enhance the amount of adhesion between the sputtered gold particles and the silicon surface a thin layer (approximately less than 50 nm) of chromium or titanium is deposited on to the exposed silicon before sputtering gold as shown in FIG. 3F. The thickness of the sputtered gold within the boundaries of the moon (12) and stars (13) patterns is about 100 nm. In alternative embodiments, other metals or ceramic particles may be sputtered on to the silicon wafer (300). This step is represented generally by blocks (203), (205) and (206) in FIG. 2.

Referring to FIG. 3G, the silicon wafer (300) is then immersed into acetone to remove the remaining photoresist mask (302) whereby the gold on the photoresist (302) will be washed away together with the photoresist (302), leaving the silicon wafer (300) covered with gold only in the area of the moon (12) and stars (13) patterns.

Thereafter, the silicon wafer (300) is bonded to a handle wafer (305) with wax (304) as shown in FIG. 3H. This step is desirable as the silicon wafer (300) with the moon (12) and stars (13) patterns are to be etched through using the etching apparatus (401). During the etching process, the backside of the silicon wafer (300) is cooled with helium which is blown towards the back of the silicon wafer (300). If the silicon wafer (300) is not bonded to a handle wafer (305), helium will blow into the process chamber when the silicon wafer (300) is partially etched through thus affecting the process. At the same time, there is risk of leaving broken silicon within the chamber.

After the wafer bonding step is completed, another layer of photoresist (306) is coated on the silicon wafer (300) for a second lithography as shown in FIG. 3I. In this step, the counter lines of the moon phase display are defined. In order to provide a photoresist (306) of suitable thickness for the etching through process whilst at the same time maintaining high enough accuracy, an AZ P4620 positive photoresist (306) is used.

In this photolithography process, as shown in FIG. 3J, the photoresist (306) is aligned with the marks on the wafer generated by the first mask (302), so as to expose the counter line of the moon phase display. Before the next step, the silicon wafer (300) covered with photoresist (306) is baked again.

Referring now to FIG. 3K, although the exposed area is still covered with silicon nitride, the silicon wafer can be transferred to a DRIE machine for etching through with a Bosch process. Advantageously, the gas for etching silicon in the Bosch process is SF6 can also etch silicon nitride such that there is no need to remove the silicon nitride layer before etching the silicon. This is one reason for choosing to use silicon nitride in the first thin film to produce the first color characteristic of the moon-phase display.

Referring to FIG. 3L, when the silicon wafer (300) is fully etched through in the DRIE machine, the moon phase display (1) is ready to be released from the handle wafer (305) in acetone or other solvent needed by for removing the bonding wax (304). After proper cleaning, the moon phase display (1) is ready to be used.

In alternative embodiments, the second color characteristic of the gold colored moon (12) and stars (13) is produced by depositing a second thin film of silicon nitride within the boundaries of the moon (12) and stars (13) patterns defined by the photoresist mask (302) instead of sputtering gold particles thereon. The deposition of the second thin film is achieved using a PECVD process. This step is represented by step (204) in FIG. 2.

Silicon nitride within the first regions defining the moon (12) and stars (13) patterns can be at least partially removed (e.g. using HF or dry etching) before the second thin film of silicon nitride is deposited therein to a thickness suitable for producing the gold color. For instance, a gold color of suitable quality for high-end watch applications may typically require a thickness of around 169 nm. This step is represented by blocks (207) and (210) in FIG. 2.

In yet alternative embodiments of the present invention, the apparatus and method may be configured to produce the gold color by depositing a second thin film within boundaries of the moon (12) and stars (13) patterns defined by the photoresist mask (302) without removing any of the first thin film within the moon (12) and stars (13) pattern boundaries such that the combined thickness of the second thin film and the first thin film are of a suitable thickness to produce the second color characteristic. This step is represented by block (209) in FIG. 2.

Yet alternatively, the apparatus for processing the first region to produce the second color characteristic is configured to thin the first thin film to a desired thickness suitable for producing the second color characteristic. The thinning can be achieved for instance by HF solution or dry etching. This step is represented by block (208) in FIG. 2.

It should be noted that a first thin film deposited by LPCVD is relatively difficult to be etched with HF (hydrogen fluoride) solution, and is suited to being etched using a dry etching method. The process temperature of LPCVD is high (i.e. normally up to around 700°) which is too high for a photoresist used in the photolithography step and restricts flexibility in the design process. For this reason, LPCVD is generally unsuitable for generating the second color characteristic. It is however suitable for producing the first color characteristic where only bare silicon wafer is used.

After the second color is fabricated, another photolithography step can be performed as represented by blocks (211) and (212) in FIG. 2 if a third color is needed. If two colors are enough the for the application, the photolithography step is to expose the boundary area for releasing etch as represented by block (213) in FIG. 2, the whole silicon wafer is immerged in acetone or other solvent for component releasing as represented by block (214) in FIG. 2.

In certain embodiments of the present invention, other components for use in a watch may be formed including for instance a silicon escape wheel, a silicon pallet fork, a silicon bridge, a silicon hour/minute/seconds hand and a silicon dial.

In yet other embodiments, components may be formed for decorative purposes applicable to devices other than watches including displays for electronic devices, jewelry and so on.

Those skilled in the art will appreciate that the invention described herein is susceptible to variations and modifications other than those specifically described without departing from the scope of the invention. All such variations and modifications which become apparent to persons skilled in the art should be considered to fall within the spirit and scope of the invention as broadly hereinbefore described. It is to be understood that the invention includes all such variations and modifications. The invention also includes all of the steps and features, referred or indicated in the specification, individually or collectively, and any and all combinations of any two or more of said steps or features.

The reference to any prior art in this specification is not, and should not be taken as, an acknowledgement or any form of suggestion that that prior art forms part of the common general knowledge.

What is claimed:

1. A method of fabricating a component for use in a watch, including a step of depositing a first thin film on a wafer wherein the first thin film is adapted to allow light reflected away from the wafer to be indicative of a first color characteristic, and, a further step of fabricating a second color characteristic on the wafer, the further step including defining a pattern on the first thin film using photolithography, and, processing a region within a boundary of the pattern so that the region is adapted to allow light reflected away from the wafer to be indicative of a second color characteristic.

2. The method of claim 1, wherein the wafer includes an opaque material.

3. The method of claim 2, wherein the wafer includes a silicon wafer.

4. The method of claim 1, wherein the wafer includes a silicon wafer.

5. The method of claim 1, wherein the step of depositing the first thin film on the wafer is performed using at least one of a plasma-enhanced chemical vapor deposition process and a low pressure chemical vapor deposition process.

6. The method of claim 1, wherein the first thin film includes a refractive index greater than 2.

7. The method of claim 1, wherein the pattern includes a moon or a star shape.

8. The method of claim 1, wherein the step of processing the region within the boundary of the pattern includes depositing a metal or a ceramic material within the boundary of the pattern which is indicative of the second color characteristic.

9. The method of claim 8, wherein the metal or ceramic material is deposited within the boundary of the pattern using at least one of a magnetron sputtering deposition process and an electron-beam evaporation deposition process.

10. The method of claim 1, wherein the step of processing the region within the boundary of the pattern includes removing at least some of the first thin film within the boundary of the pattern and thereafter depositing a second thin film therein wherein the second thin film is adapted to produce the second color characteristic.

11. The method of claim 10, wherein the second thin film is deposited using a plasma-enhanced chemical vapor deposition process.

12. The method of claim 10, wherein the step of processing the region within the boundary of the pattern includes thinning the first thin film within the boundary of the pattern to a thickness suitable for producing the second color characteristic.

13. The method of claim 12, wherein at least one of the first thin film and the second thin film include a silicon nitride material.

14. The method of claim 1, wherein the step of processing the region within the boundary of the pattern includes depositing a second thin film within the region within the boundary of the pattern without removing any of the first thin film within the boundary of the pattern such that the second thin film either alone or in combination with the first thin film is adapted to produce the second color characteristic.

* * * * *